United States Patent [19]

Kikuchi et al.

[11] Patent Number: 5,228,052
[45] Date of Patent: Jul. 13, 1993

[54] PLASMA ASHING APPARATUS

[75] Inventors: Masashi Kikuchi; Richard L. Bersin; Masaki Uematsu, all of Chigasaki, Japan

[73] Assignee: Nihon Shinku Gijutsu Kabushiki Kaisha, Chigasaki, Japan

[21] Appl. No.: 757,766

[22] Filed: Sep. 11, 1991

[51] Int. Cl.$^5$ ............................................. H05B 7/00
[52] U.S. Cl. .............................. 373/18; 373/2;
373/3; 373/27; 373/118; 373/124; 373/110;
156/345; 156/643; 204/298.37; 118/728;
427/569
[58] Field of Search ............ 373/18, 2, 3, 62, 64,
373/27, 124, 123, 118, 109, 110; 156/643, 345;
219/390, 354, 405, 411; 204/298.37, 298.38;
118/728; 427/38, 39

[56] References Cited

U.S. PATENT DOCUMENTS

| | | | |
|---|---|---|---|
| 4,292,384 | 9/1981 | Straughan et al. | 156/643 |
| 4,533,820 | 8/1985 | Shimizu | 219/411 |
| 4,961,812 | 10/1990 | Baerg et al. | 156/345 |
| 4,983,254 | 1/1991 | Fujimura et al. | 156/643 |
| 4,985,109 | 1/1991 | Otsubo et al. | 156/345 |
| 5,034,086 | 7/1991 | Sato | 156/345 |

OTHER PUBLICATIONS

"High Dose Ion Implantation into Photoresist", Solid-State Science and Technology, Aug. 1978, pp. 1293-1298.

"Carbonized Layer Formation in Ion Implanted Photoresist Masks", Neclear Instrument and Methods in Physics Research, B7/8(1985), pp. 501-506.

Primary Examiner—Bruce A. Reynolds
Assistant Examiner—Tu Hoang
Attorney, Agent, or Firm—Armstrong, Westerman, Hattori, McLeland & Naughton

[57] ABSTRACT

A plasma ashing apparatus has a vacuum treatment chamber for receiving therein a substrate coated with a resist film, a reactive gas introduction pipe equipped with a plasma applicator, a vacuum exhaust pipe, a heating means for heating the substrate, and two pieces of electrodes disposed in parallel to each other. One of the electrodes is a substrate electrode and the other thereof is a circular counter electrode. These two electrodes are commonly connected to an RF power source to thereby constitute a cathode electrode. Multiple concentric perforations are formed in the counter electrode except for a rib portion. A central perforation is formed in the center of the counter electrode. The concentric perforations are formed at every distance, from the center, equivalent to a diameter of the central perforation, while leaving circular electrode surfaces corresponding in width to a radius of of the perforation.

7 Claims, 4 Drawing Sheets

PLASMA ASHING APPARATUS

BACKGROUND OF THE INVENTION

This invention relates to a plasma ashing apparatus which has a cathode electrode and in which a resist film coated on a semiconductor substrate is removed by ashing by utilizing a plasma.

In order to fabricate fine integrated circuits, it has hitherto been practiced to provide on a surface of a semiconductor substrate a resist film having thereon a circuit pattern and then to etch this pattern into an insulating film, a semiconductor film, or a metallic film which lies under the resist film.

The resist film is removed from the substrate after the etching treatment has been finished. As a method of removing the resist film, there are a wet treatment method in which chemicals such as hydrogen peroxide, organic solvents or the like are used, and a dry treatment method in which the resist film is ashed by using an oxygen plasma.

In the wet treatment method, attention must be paid to the safety and, since impurities adhere to the substrate, this method is not suitable to fine fabrication of VLSI circuits.

In the dry treatment method, a resist film of $C_xH_yN_z$ coated on the substrate is removed by causing it to react with oxygen radicals generated in the oxygen plasma, thereby decomposing and evaporating it into $CO_2$, $NO_2$ and $H_2O$. Therefore, there is no problem, unlike in the wet treatment method, of safety and adhesion of impurities and is suitable to the fine fabrication of the substrate. In this case, the substrate and the resist film are heated for reaction with the radicals.

However, when the substrate coated with the resist film is subjected to irradiation of ion beams, the surface layer 2a of the resist film 2 is affected and hardened as shown in FIG. 1. As a consequence, stresses come to be accumulated inside the resist film 2 and, should the substrate 1 be heated suddenly, there are cases where the resist film 2 is exploded. Those flakes of the resist film 2 which are generated in this explosion stay on the substrate 1 or inside a vacuum treatment chamber as dust and residual matter, and become obstacles in the fine fabrication of the substrate 1. According to experiments, the lower limit temperature of explosion of the resist film 2 is from about 70° C. to 160° C., though it varies with the ion implantation conditions and the kind of resist film, and it has been found that the larger the width of the resist film 2, the easier the explosion.

In order to eliminate this kind of obstacle associated with the dry type of ashing method, the inventors of this application previously proposed an improved plasma ashing apparatus as shown in FIG. 2 (U.S. patent application Ser. No. 462,380). That plasma ashing apparatus is provided with a vacuum treatment chamber 5 to one side of which is connected an introduction pipe 3 for introducing a reactive gas such as oxygen or the like and, also, to a bottom of which is connected a vacuum exhaust pipe 4 which is in communication with an exhaust pump 4a. In an intermediate portion of the introduction pipe 3 which is connected to a reactive gas source 6, there is provided a plasma applicator 9 which comprises a microwave power source 7 and a microwave discharging member 8. Inside the vacuum treatment chamber 5, there are disposed a heating means 10 in the form of an electric heater to heat the substrate 1 and two pieces of plate-like electrodes which are parallel to each other, namely, a substrate electrode 11 and a counter electrode 12. By means of pins 13 which move up and down through the substrate electrode 11, a substrate 1 coated with a resist film is placed movably upward and downward between a position in which it contacts the surface of the substrate electrode 11 and a position in which it is lifted off the surface of the substrate electrode 11. The substrate electrode 11 is connected to an RF power source 14 and the counter electrode 12 is connected to ground 15. Numeral 16 denotes a lifting apparatus to move up and down the pins 13.

In case the resist film 2 which has been affected and hardened at its surface layer 2a as shown in FIG. 1 is removed by ashing in this ashing apparatus, a reactive gas such, for example, as oxygen gas is introduced through the gas introduction pipe 3. An RF plasma is generated between the substrate electrode 11 and the counter electrode 12 by supplying electricity from the RF power source 14 to the substrate electrode 11 on which the substrate 1 is placed. The resist film 2 is subjected to etching by the oxygen ions, for example, generated therein, thereby peeling off the affected and hardened portion of the surface layer 2a. Subsequently, the oxygen radicals are introduced into the vacuum treatment chamber 5 while the substrate 1 is heated by the heating means 10 and the plasma applicator 9 provided in the introduction pipe 3 is operated. The oxygen radicals are thus caused to react with the remaining portion of the resist film 2 on the substrate 1, thereby decomposing and evaporating it into $CO_2$, $NO_2$ and $H_2O$ for exhausting out of the vacuum treatment chamber 5. The counter electrode 12 is provided with small perforations 17 through which the reactive gas can pass.

In case of peeling off the surface layer 2a of the resist film 2 by etching by ions with the ashing apparatus as shown in FIG. 2, the counter electrode 12 is in ground electric potential and the substrate electrode 11 becomes the negative electric potential. Ions in the plasma are, however, hard to be collected to the side of the substrate electrode 11, and this electrode 11 gives rise to self-bias voltage, resulting in incidence of high-energy ions on the substrate 1. As a consequence, there was a disadvantage in that the substrate 1 itself or the circuit formed on the substrate 1 is damaged.

This invention has an object of providing a dry type of plasma ashing apparatus in which the explosion of the resist film does not occur. Another object of this invention is to provide an ashing apparatus in which the resist film can be ashed without damaging the substrate.

SUMMARY OF THE INVENTION

In order to attain the above-described objects, this invention is a plasma ashing apparatus having:

a vacuum treatment chamber for receiving therein a substrate coated with a resist film;

the vacuum treatment chamber having connected thereto a reactive gas introduction pipe equipped with a plasma applicator, and a vacuum exhaust pipe;

the vacuum treatment chamber having therein heating means for heating the substrate, and two pieces of electrodes disposed in parallel to each other, one of the electrodes being a substrate electrode and the other thereof being a counter electrode;

the substrate being disposed in the vacuum treatment chamber such that it is movable between a position in which it contacts a front surface of the substrate electrode and a position in which it is lifted off the surface, whereby the resist film on the substrate is removed by etching by ions and by ashing by radicals in a reactive gas to be introduced from the introduction pipe;

wherein the substrate electrode and the counter electrode are commonly connected to an RF power source to thereby constitute a cathode electrode; and multiple concentric perforations are formed in the counter electrode except for a rib portion.

In one preferred embodiment of this invention, the counter electrode has a disk shape, a central perforation is formed in the center thereof, and concentric perforations are formed at every distance, from the center, equivalent to a diameter of the central perforation, while leaving circular electrode surfaces corresponding in width to a radius of the central perforation. In still another preferred embodiment, a dummy electrode of ground electric potential is provided in the central perforation and, in addition, a circular peripheral wall portion which projects towards the substrate electrode is formed in a periphery of the counter electrode.

In case that resist film on the substrate which has an affected and hardened surface layer, as shown in FIG. 1, is removed in the ashing apparatus provided with the cathode electrode for ashing process, a reactive gas such as oxygen gas is introduced from the gas introduction pipe. Electric power is supplied from the RF power source to the substrate electrode and the counter electrode which together constitute the cathode electrode, thereby generating an RF plasma between it and an appropriate anode. Since the substrate electrode and the counter electrode are in the same RF electric potential, the electrons in the plasma are reflected by the electric potential of those electrodes and cannot reach those electrodes but are returned to the plasma. These reciprocating movements of the electrons accelerate the ionization of the reactive gas inside the vacuum treatment chamber. An increase in the ionization efficiency of the reactive gas is accompanied by the effect of increasing the discharging electric current. If the same applied power is supplied from the RF power source, the voltage of the cathode electrode will drop. In other words, the self-bias voltage of the cathode electrode can be dropped, and the energy at which the ions of the reactive gas strike against the substrate which is provided on the surface of the substrate electrode becomes smaller, resulting in smaller damages to the substrate due to the ion impact. Further, by forming multiple concentric perforations in the counter electrode which constitutes the cathode electrode, except for the rib portion, it is possible to remove the surface layer of the resist film coated on the substrate with a highly uniform distribution. Thereafter, in the same manner as in the previously proposed apparatus, the plasma applicator provided in the introduction pipe is operated while the substrate is being heated with the heating means to introduce the oxygen radicals into the vacuum treatment chamber. The remaining portion of the resist film is caused to react with the oxygen radicals to decompose and evaporate the resist film into $CO_2$, $NO_2$ and $H_2O$ for exhausting out of the vacuum treatment chamber.

In order to attain the uniformity in etching it was found best that the counter electrode is formed into a disk form, that the central perforation is formed in the center of the counter electrode, and that the above-described concentric perforations are formed at every distance, from the center, equivalent to the diameter of the central perforation, while leaving circular electrode surfaces corresponding in width to the radius of the central perforation.

DETAILED DESCRIPTION OF THE INVENTION

Figure 1:
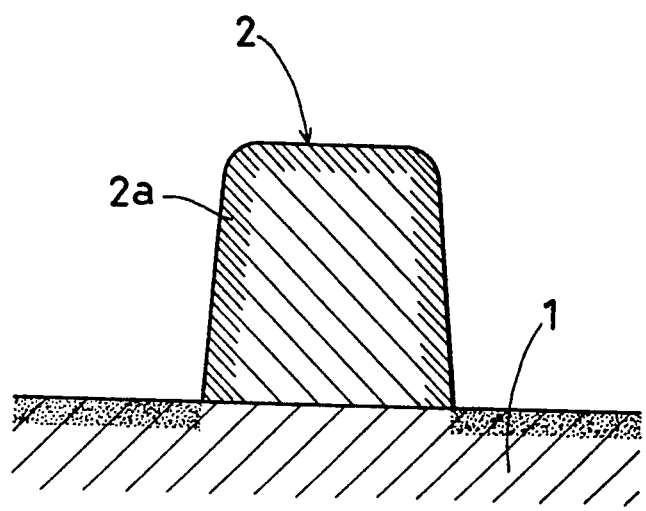
FIG. 1 is an enlarged sectional view of a resist film coated on a substrate.

Embodying examples of this invention will be explained with reference to FIGS. 3 through 10. In these figures, the same numerals are given to those parts which are in common with those shown in FIGS. 1 and 2. In a vacuum treatment chamber 5 of a plasma ashing apparatus, there are connected to a side thereof a reactive gas introduction pipe 3 which is provided with a plasma applicator 9, and to a bottom thereof a vacuum exhaust pipe 4. To this introduction pipe 3, there is connected a gas source 6 which comprises a gas bomb filled with a reactive gas such, for example, as $O_2$ gas, $N_2$ gas, $H_2$ gas, $N_2+H_2(3\%)$ gas, $CH_4$ gas or the like. Thus, oxygen gas, for example, is introduced into the vacuum treatment chamber 5 through the introduction pipe 3. An exhaust pump 4a is connected to the exhaust pipe 4 for exhausting the vacuum treatment chamber 5. The plasma applicator 9 comprises a microwave power source 8 and a microwave discharging member 8. When the plasma applicator 9 is operated while the reactive gas flows through the introduction pipe 3, the reactive gas is ionized by a plasma to be generated in an intermediate portion of the introduction pipe 3, thereby generating radicals. The radicals are introduced into the vacuum treatment chamber 5 for ashing.

Inside the vacuum treatment chamber 5, there are provided a heating means 10 comprising an electric heater for heating a substrate 1, and two pieces of electrodes of a substrate electrode 11 and a counter electrode 12 which are parallel to each other and are mounted on appropriate holding members (not shown) of electrically insulating material. The substrate 1 coated with a resist film 2, as shown in FIG. 1, is placed on the front surface side of the substrate electrode 11, i.e., on that side which faces the counter electrode 12. When a plurality of pins 13 which penetrate through the substrate electrode 11 are lifted by a lifting apparatus 16 which is provided outside the vacuum treatment chamber 5, the substrate 1 is supported by the tips of the pins 13, so that it is lifted off the surface of the substrate electrode 11. It is therefore made possible to ash the resist film which has been adhered over to the rear side of the substrate 1.

Figure 2:
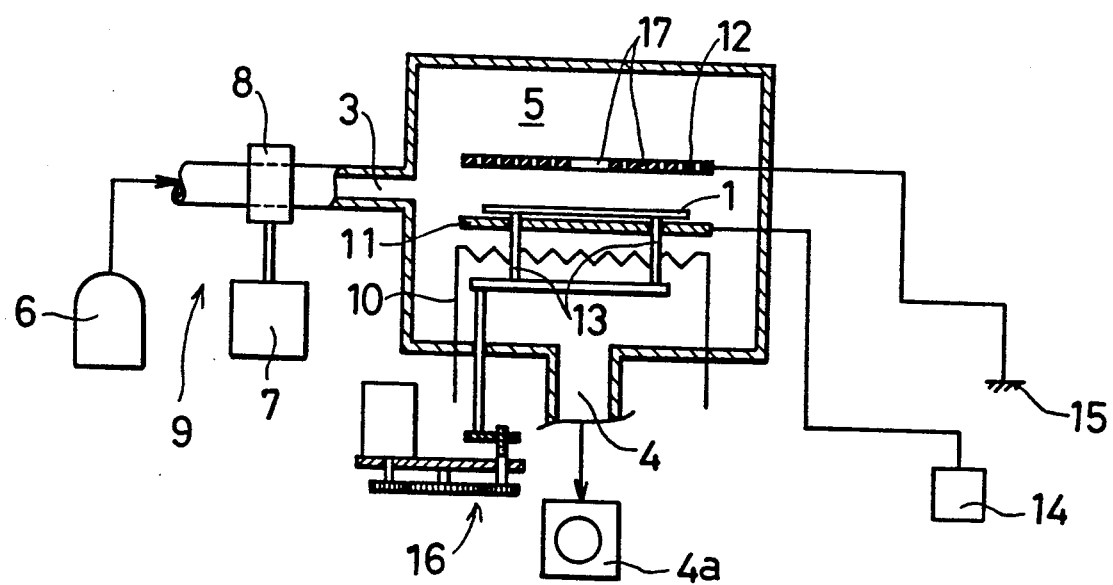
FIG. 2 is a sectional side view of a previously proposed plasma ashing apparatus.
Figure 3:
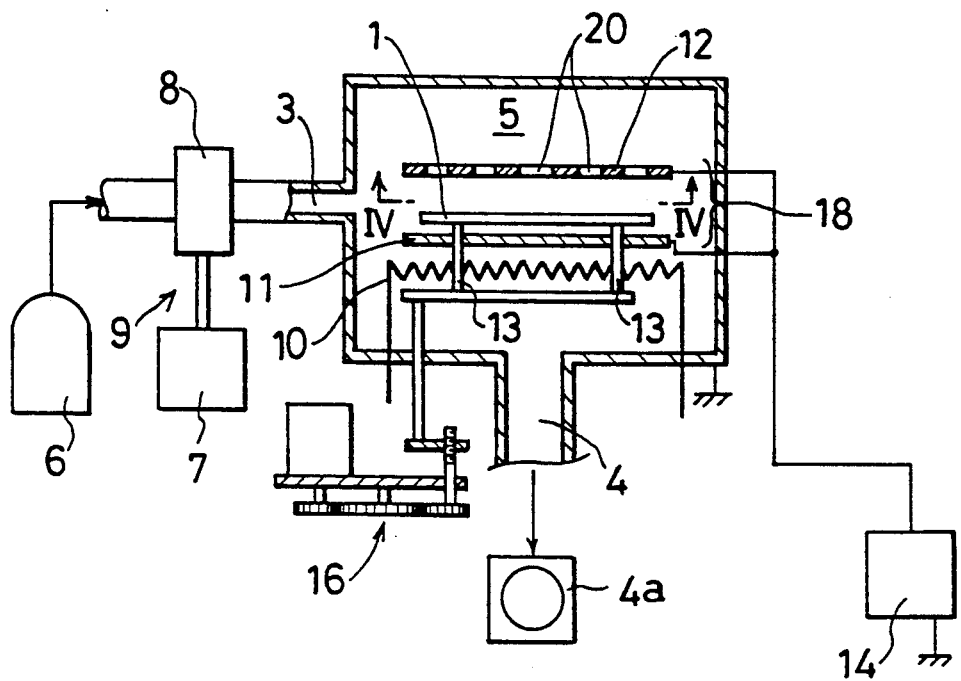
FIG. 3 is a sectional side view of an embodiment of this invention.
Figure 4:
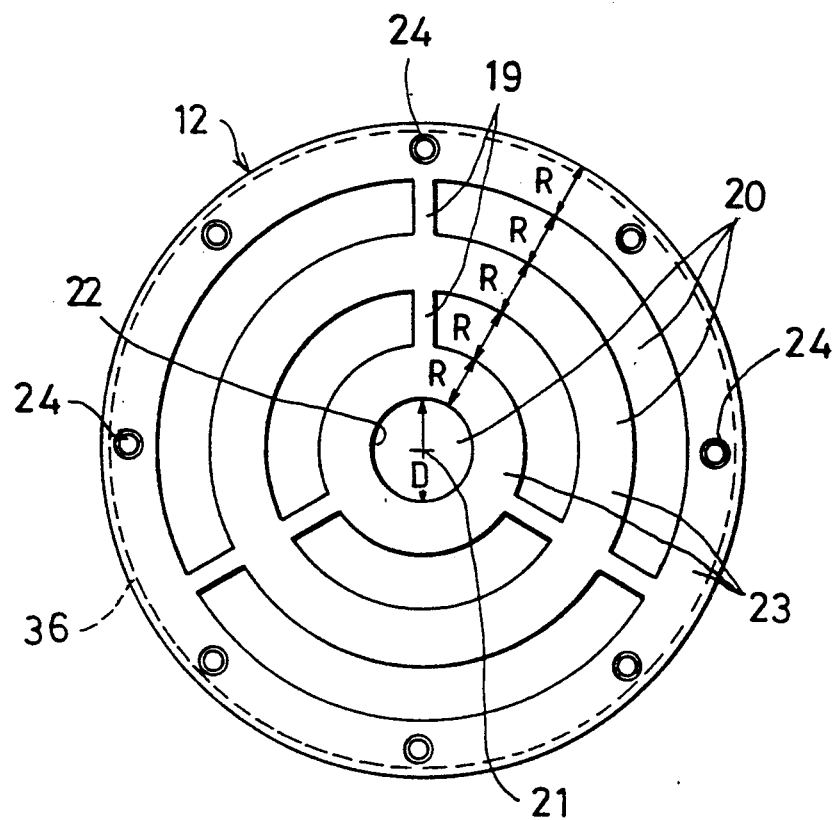
FIG. 4 is an enlarged view taken along the line IV—IV of FIG. 3.
Figure 5:
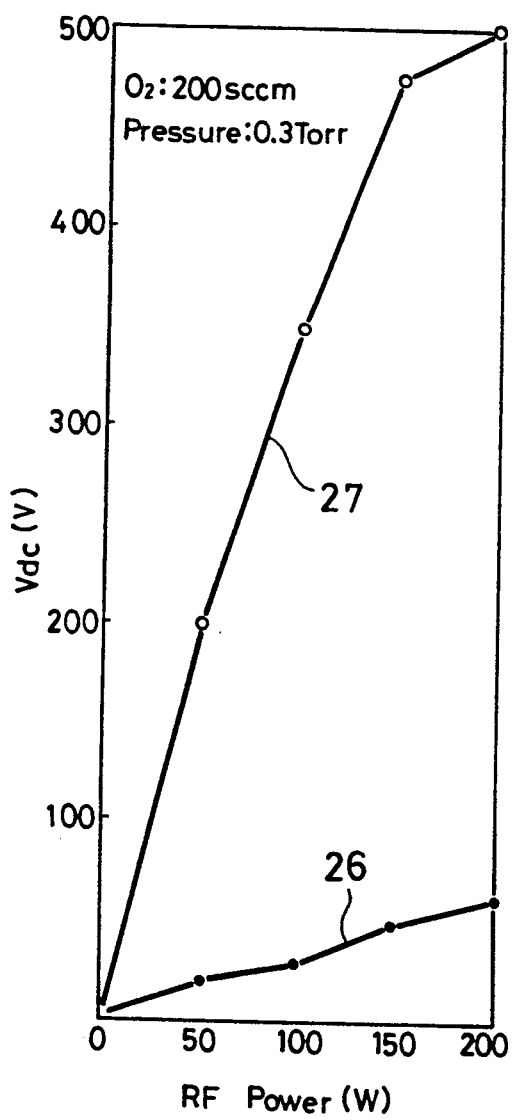
FIG. 5 is a diagram showing a self-bias voltage of a counter electrode.
Figure 6:
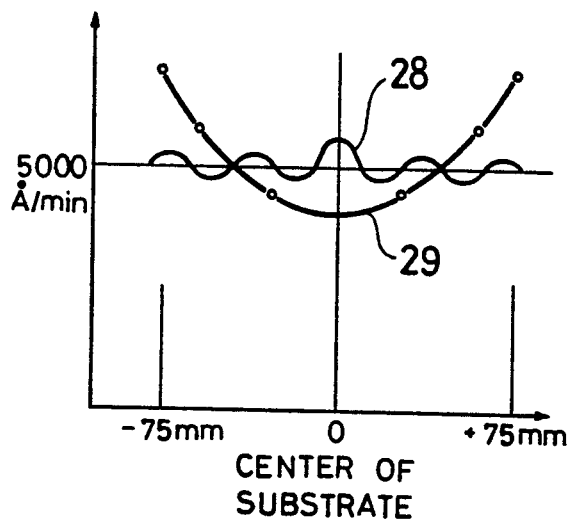
FIGS. 6, 7, and 9 are diagrams showing the changes in ashing speed at each point of a substrate.

The above-described construction of the ashing apparatus is not different from that of the previously proposed ashing apparatus as shown in FIG. 2. In this invention, however, the substrate electrode 11 and the counter electrode 12 are commonly connected to an RF power source 14 to make them a cathode electrode 18. It is also so arranged that multiple concentric perforations 20 are formed, as shown in FIG. 4, in the counter electrode 12 except at rib portions 19. These perforations 20 have a function of uniformly ashing the resist film 2 on the substrate 1. According to repeated experiments by the inventors, it has been found that the best results in etching uniformity can be obtained with the counter electrode 12, as shown in FIG. 4, which has an external shape of a disk, has a circular central perforation 22 in the center 21 thereof, and has dual concentric perforations 20, while leaving electrode surfaces 23 of a width corresponding to the radius R of the central perforation 22, said perforations 20 being disposed around the center 21 of the counter electrode 12 with each distance therebetween corresponding to the diameter D of the central perforation 22. In that peripheral portion of the electrode surface 23 which is left in the periphery of the counter electrode 12, there are provided 8 screw holes 24 for fixing at an equal distance therebetween. As a concrete example of the dimensions of the counter electrode 12, the counter electrode 12 was formed of an aluminum plate of 2 mm thick and 150 mm in diameter. The central perforation 22 was formed in 25 mm in diameter D and the dual concentric perforations 20 were formed in 12.5 mm in width, and the concentric electrode surfaces 23 to be formed in triple were formed in 12.5 mm in width, respectively. The surface of the counter electrode 23 was coated with $Al_2O_3$. The substrate electrode 11 was also made of aluminum and the surface thereof was coated with $Al_2O_3$.

The operation of removing the resist film 2 having an affected and hardened surface layer 2a, as shown in FIG. 1, from the substrate 1 by the ashing apparatus is explained in detail hereinbelow.

First, a circular substrate 1 of 150 mm in diameter having a resist film 2 of fine width was placed on the substrate electrode 11 of 150 mm in diameter. The inside of the vacuum treatment chamber 5 was evacuated through the vacuum exhaust pipe 4 to a vacuum of 0.3 Torr, and 200 SCCM of reactive gas such as oxygen gas was introduced thereinto. By supplying electric current from the RF power source 14 to the substrate electrode 11 and the counter electrode 12 both of which constitute the cathode electrode 18, an RF plasma was generated between the cathode electrode and an appropriate anode such, for example, as a chamber wall of the vacuum treatment chamber 5 which is connected to ground. Since the substrate electrode 11 and the counter electrode 12 are in the same RF electric potential, the electrons in the plasma are reflected due to the electric potential of these electrodes and, therefore, cannot reach these electrodes but are returned to plasma. By these reciprocating movements of the electrons, the ionization of the reactive gas inside the vacuum treatment chamber 5 is accelerated. When the ionization efficiency of the reactive gas is increased, the discharging electric current increases. When the same applied power is supplied from the RF power source 14, the self-bias voltage of the cathode electrode 18 is decreased, and the energy at which the ions of the reactive gas is incident on the substrate 1 decreases. Therefore, the damage on the substrate 1 due to the ion impact is reduced. The self-bias voltage $V_{dc}$ generated on the cathode electrode 18 at that time was measured and was found to be a small value as shown by curve 26 in FIG. 5. For the purpose of comparison, the value of the self-bias voltage of the previously proposed cathode electrode comprising a single piece of substrate electrode 11 as shown in FIG. 2 is shown by curve 27. As can be seen from them, the self-bias voltage of the cathode electrode comprising 2 pieces of substrate electrode 11 and the counter electrode 12 was as low as about 1/7 that of the conventional cathode.

Since there are formed in the counter electrode 12 multiple concentric perforations 20 except at the rib portion 19, it is possible to remove by etching by ions in plasma the surface layer 2a of the resist film 2 coated on the substrate 1 at a highly uniform distribution. When the uniformity of the etching of the resist film was measured by operating only the cathode electrode 18, a highly uniform distribution below about ±10% was obtained as shown by curve 28 in FIG. 6. For the purpose of comparison, there is shown by curve 29 a distribution of uniformity at the time when the affected and hardened layer 2a of the substrate was etched by the previously proposed apparatus as shown in FIG. 2 under the same conditions. In the previously proposed apparatus as shown in FIG. 2, since the chamber wall of the vacuum treatment chamber becomes ground electric potential, the plasma is likely to concentrate towards the chamber wall if the counter electrode 12 is in a plate-like electrode. As a consequence, as shown by curve 29, the etching speed becomes faster around the external periphery of the substrate 1, resulting in a uniformity as poor as ±30%.

When the affected and hardened surface layer 2a of the resist film 2 of the substrate 1 has been removed by etching substantially uniformly by the ions, the plasma applicator 9 provided in the introduction pipe 3 is operated while the substrate 1 is being heated by the heating means 10 in the same manner as the previously proposed one. Oxygen radicals are thus caused to be generated in the oxygen gas to be introduced into the vacuum treatment chamber 5, and the remaining portion of the resist film 2 and the oxygen radicals are reacted to decompose and evaporate it into $CO_2$, $NO_2$ and $H_2O$, thereby removing it out of the vacuum treatment chamber 5 trough the vacuum exhaust pipe 4.

By the above-described process the resist film 2 having the affected and hardened surface layer 2a can be ashed without explosion thereof.

The uniformity of etching at the time of discharging of the cathode electrode 18 was good when the counter electrode 12 was formed into a disk shape, the central perforation 22 was formed in the center thereof, the above-described concentric perforations 20 were formed at every distance equivalent to the radius of the central perforation 22 away from the center thereof while leaving circular electrode surfaces 23 which are equivalent in width to the radius of the central perforation 22, and the widths of the electrode surfaces 23 and of the concentric perforations were made equal.

Figure 7:
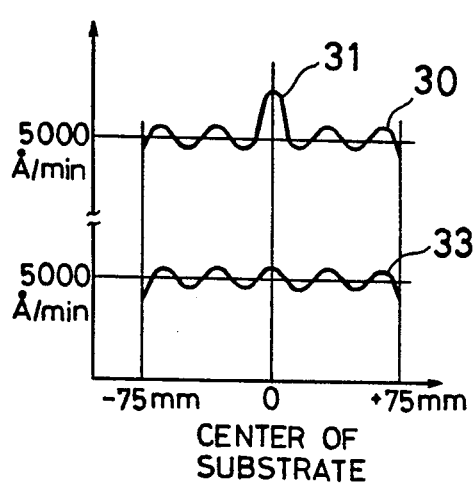
Figure 8:
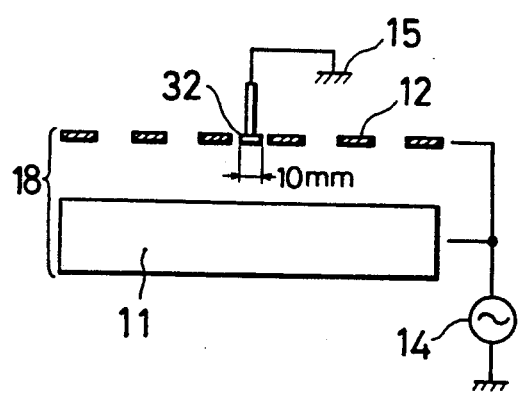
FIGS. 8 and 10 are explanation diagrams of other embodiments of this invention.

However, the etching speed of that portion of the resist film 2 which faces the central perforation 22 of the counter electrode 12 had a tendency of becoming faster than that of the other portions, as can be seen from the peak portion 31 of curve 30 in FIG. 7. Therefore, a dummy electrode 32 of cylindrical shape of ground electric potential was provided in the central perforation 22 as shown in FIG. 8. Then, it was possible to attain a substantially uniform distribution of etching speed with the discharging speed at the portion opposing the central perforation kept under control. In case the central perforation 22 was 25 mm in diameter, a circular dummy electrode 32 of 10 mm in diameter was used.

Figure 9:
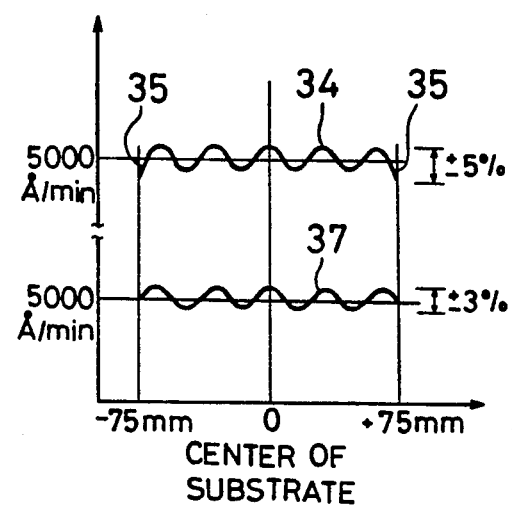
Figure 10:
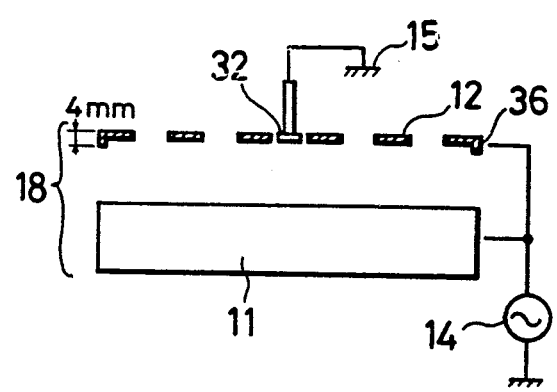

In addition, the etching speed of that resist film 2 which faces the peripheral portion of the counter electrode 12 was, as shown at both ends of curve 34 in FIG. 9, likely to become slower, and there was an etching speed difference of ±5% between the fastest portion and the slowest portion. Then, when a circular wall portion 36 which projects towards the substrate electrode 11 was formed in the periphery of the counter electrode 12 as shown in FIGS. 4 and 10, the etching speed of that portion of the resist film 2 which faces the peripheral portion of the counter electrode 12 increased as shown by curve 37 in FIG. 9. Consequently, the etching speed difference was unified and was able to limit it within a range of ±3%. In case the counter electrode 12 was 150 mm in diameter, the peripheral wall portion was formed in 4 mm in height.

In any of the embodiments, the surface of the counter electrode 12 was coated with aluminum oxide.

As described above, according to this invention, since the substrate electrode and the counter electrode, which are provided in parallel to each other inside the vacuum treatment chamber of the plasma ashing apparatus, are connected to the RF power source to constitute the cathode electrode, and since multiple concentric circular perforations are formed in the counter electrode except for the rib portion, it is possible to obtain the effects that the ashing of the resist film whose surface layer has been affected and hardened can be uniformly performed without giving damages to the substrate and without explosion of the resist film.

It is readily apparent that the above-described has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the scope of the invention.

What is claimed is:

1. A plasma ashing apparatus having:
   a vacuum treatment chamber for receiving therein a substrate coated with a resist film;
   said vacuum treatment chamber having connected thereto a reactive gas introduction pipe equipped with a plasma applicator, and a vacuum exhaust pipe;
   said vacuum treatment chamber having therein heating means for heating said substrate, and two pieces of electrodes disposed in parallel to each other, one of said electrodes being a substrate electrode and the other thereof being a counter electrode;
   said substrate being disposed in said vacuum treatment chamber such that it is movable between a position in which it contacts a front surface of said substrate electrode and a position in which it is lifted off said surface, whereby the resist film on said substrate is removed by etching by ions and by ashing by radicals in a reactive gas to be introduced from said introduction pipe;
   wherein said substrate electrode and said counter electrode are commonly connected to an RF power source to thereby constitute a cathode electrode; and
   wherein multiple concentric circumferentially extending apertures are formed in said counter electrode with radially extending electrode rib portions intersecting said apertures.

2. A plasma ashing apparatus according to claim 1, wherein said counter electrode has a disk shape;
   a central perforation is formed in a center of said counter electrode; and
   said concentric circumferentially extending apertures are formed at distances from said center which are multiples of a diameter of said central perforation thus defining circular electrode surfaces between said apertures corresponding in width to a radius of said central perforation.

3. A plasma ashing apparatus according to claim 2, wherein a dummy electrode of ground electric potential is provided in said central perforation.

4. A plasma ashing apparatus according to claim 2, wherein a circular peripheral wall portion which projects towards said substrate electrode is formed in a periphery of said counter electrode.

5. A plasma ashing apparatus according to claim 4, wherein a surface of said counter electrode is coated with aluminum oxide.

6. A plasma ashing apparatus according to claim 1, wherein said cathode electrode connected to said RF power source discharges between said cathode electrode and an appropriate anode which includes a chamber wall of said vacuum treatment chamber.

7. A plasma ashing apparatus having:
   a vacuum treatment chamber for receiving therein a substrate coated with a resist film;
   said vacuum treatment chamber having connected thereto a reactive gas introduction pipe equipped with a plasma applicator, and a vacuum exhaust pipe;
   said vacuum treatment chamber having therein heating means for heating said substrate, and two pieces of electrodes disposed in parallel to each other, one of said electrodes being a substrate electrode and the other thereof being a counter electrode;
   said substrate being disposed in said vacuum treatment chamber such that it is movable between a position in which it contacts a front surface of said substrate electrode and a position in which it is lifted off said surface, whereby the resist film on said substrate is removed by etching by ions and by ashing by radicals in a reactive gas to be introduced from said introduction pipe;
   wherein said substrate electrode and said counter electrode are commonly connected to an RF power source to thereby constitute a cathode electrode; and
   multiple concentric perforations are formed in said counter electrode except for a rib portion;
   wherein said counter electrode has a disk shape, a central perforation being formed in a center of said counter electrode, and the concentric perforations being formed at distances from the center which are multiples of a diameter of the central perforation thus defining circular electrode surfaces corresponding in width to a radius of the central perforation; and
   wherein a dummy electrode of ground electric potential is provided in the central perforation.

* * * * *